United States Patent
Yap

(10) Patent No.: US 7,103,707 B2
(45) Date of Patent: Sep. 5, 2006

(54) ACCESS CONTROL UNIT AND METHOD FOR USE WITH SYNCHRONOUS DYNAMIC RANDOM ACCESS MEMORY DEVICE

(75) Inventor: Chang-Cheng Yap, Hsin Chu (TW)

(73) Assignee: RDC Semiconductor Co., Ltd., (TW)

( * ) Notice: Subject to any disclaimer, the term of this patent is extended or adjusted under 35 U.S.C. 154(b) by 441 days.

(21) Appl. No.: 10/729,361

(22) Filed: Dec. 4, 2003

(65) Prior Publication Data
US 2005/0125596 A1 Jun. 9, 2005

(51) Int. Cl.
*G06F 13/16* (2006.01)
(52) U.S. Cl. .......................... 711/105; 710/35; 365/193
(58) Field of Classification Search ...................... None
See application file for complete search history.

(56) References Cited
U.S. PATENT DOCUMENTS 5,850,632 A * 12/1998 Robertson ................... 711/170
6,337,809 B1 * 1/2002 Kim et al. ............. 365/189.05
6,968,419 B1 * 11/2005 Holman .......................... 711/5

* cited by examiner

*Primary Examiner*—B. James Peikari
(74) *Attorney, Agent, or Firm*—Peter F. Corless; Steven M. Jensen; Edwards Angell Palmer & Dodge, LLP

(57) ABSTRACT

An access control unit and method is proposed for use with an SDRAM (Synchronous Dynamic Random-Access Memory) device to control each round of burst-transfer type of access operation on the SDRAM device. The proposed access control unit and method is characterized by that the column-address strobe signal involved in each round of the burst-transfer access operation is continuously set at active state for a period of clock pulses equal in number to the specified burst length of the burst-transfer access operation, rather than just for a period of one pulse. This feature allows external circuitry to arbitrarily change the burst length, and also allows no use of burst-stop command or a precharge-interrupt method to stop each round of the burst-transfer access operation, allowing the access control logic circuit architecture to be more simplified than the prior art.

8 Claims, 2 Drawing Sheets

ACCESS CONTROL UNIT AND METHOD FOR USE WITH SYNCHRONOUS DYNAMIC RANDOM ACCESS MEMORY DEVICE

BACKGROUND OF THE INVENTION

1. Field of the Invention

This invention relates to computer memory technology, and more particularly, to an access control unit and method for use with an SDRAM (Synchronous Dynamic Random Access Memory) chip for controlling a burst transfer access operation on the SDRAM chip.

2. Description of Related Art

SDRAM (Synchronous Dynamic Random Access Memory) is an advanced type of DRAM (Dynamic Random Access Memory), which is characterized by that the data access rate is synchronized with CPU's clock signal, allowing the CPU to retrieve data from SDRAM without latency so that the access speed is increased. An SDRAM device operates in two modes: interleaved mode or sequential mode.

With the above-mentioned SDRAM characteristics, the required access control circuitry for an SDRAM chip should be designed to comply with these requirements so as to be able to perform the data access operations.

One drawback to conventional SDRAM access control units, however, is that the burst length in each burst transfer access operation is a fixed amount of data, such as 8 bits or 16 bits, and cannot be changed arbitrarily.

Still another drawback of conventional SDRAM access control units is that at the completion of each burst transfer access operation, a burst stop command or a precharge interrupt method should be used to terminate the burst transfer access operation, which makes the required logic circuitry more complex in structure.

SUMMARY OF THE INVENTION

It is therefore an objective of this invention to provide an SDRAM access control unit and method which allows the burst length in each burst transfer access operation to be changed arbitrarily.

It is another objective of this invention to provide an SDRAM access control unit and method which allows each burst transfer access operation to be terminated without having to use a burst stop command or a precharge-interrupt method so that the required logic circuitry can be made less complex in structure than prior art.

The proposed access control unit and method is characterized by that the column-address strobe signal involved in each round of the burst-transfer access operation is continuously set at active state for a period of clock pulses equal in number to the specified burst length of the burst-transfer access operation, rather than just for a period of one pulse. This feature allows external circuitry to arbitrarily change the burst length, and also allows no use of burst-stop command or a precharge-interrupt method to stop each round of the burst-transfer access operation, allowing the access control logic circuit architecture to be more simplified than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The SDRAM access control unit and method according to the invention is disclosed in full details by way of preferred embodiments in the following with reference to the accompanying drawings.

Figure 1:
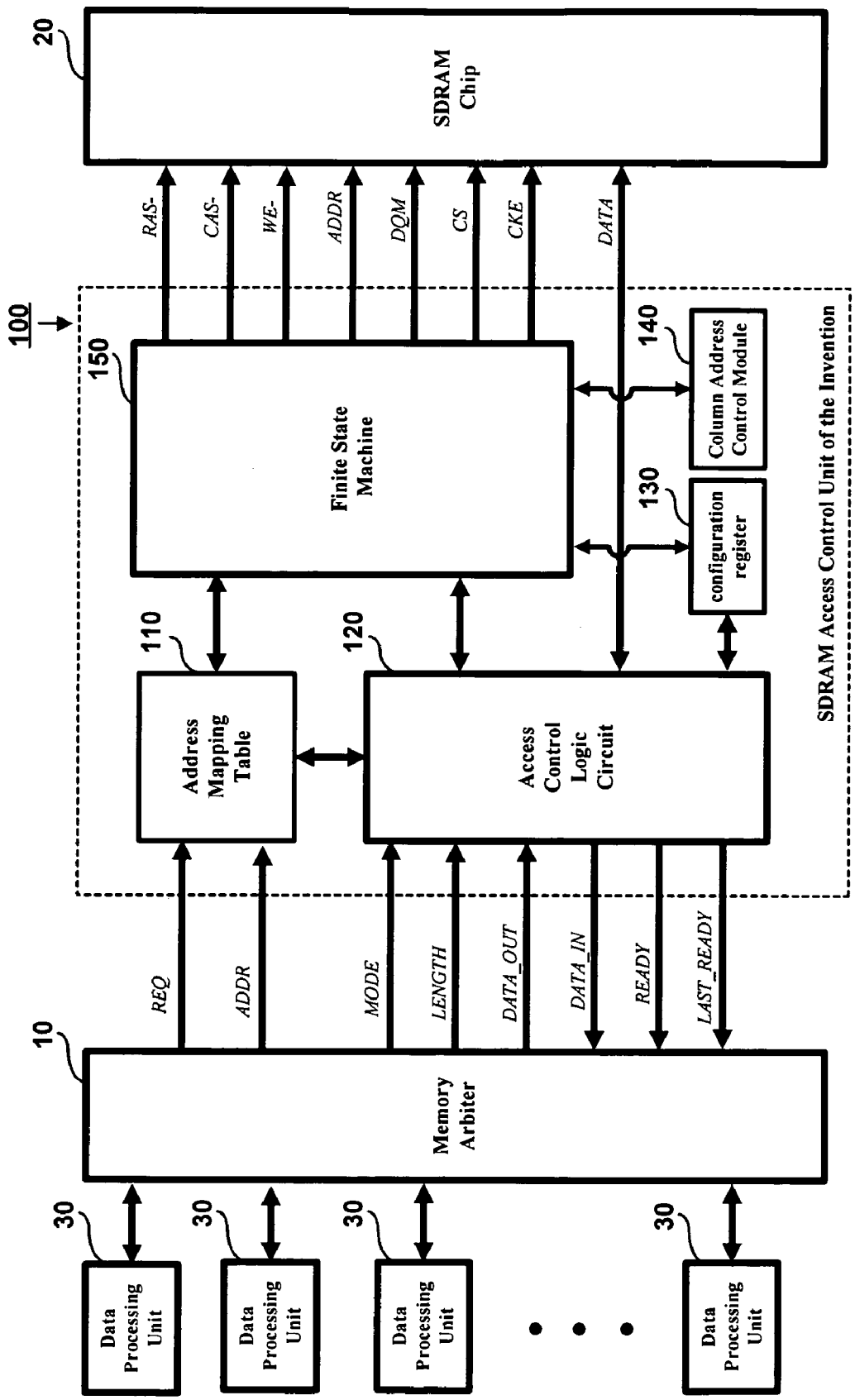
FIG. 1 is a schematic block diagram showing the system architecture of the SDRAM access control unit according to the invention.

FIG. 1 is a schematic block diagram showing the system architecture of the SDRAM access control unit according to the invention (as the part enclosed in the dotted box indicated by the reference numeral 100). As shown, in practical use, the SDRAM access control unit of the invention 100 is coupled between an SDRAM chip 20 and a memory arbiter 10 connected to a plurality of data processing units 30, for the purpose of controlling the data flow between the memory arbiter 10 and the SDRAM chip 20, including data write operations to the SDRAM chip 20 and data read operations from the SDRAM chip 20. The SDRAM chip 20 can be either a conventional SDRAM, an advanced DDR (Double Data Rate) SDRAM chip, or a memory chip having similar SDRAM characteristics.

The SDRAM access control unit of the invention 100 is interconnected with the memory arbiter 10 via a number of signal lines as follows:

(A1) REQ, which is used for the memory arbiter 10 to issue a write/read request to the SDRAM access control unit of the invention 100;

(A2) ADDR, which is used for the memory arbiter 10 to issue an address signal to the SDRAM access control unit of the invention 100;

(A3) LENGTH, which is used for the memory arbiter 10 to issue a burst length signal to the SDRAM access control unit of the invention 100 to indicate of the length of data for each burst;

(A4) MODE, which is used for the memory arbiter 10 to issue a mode signal to the SDRAM access control unit of the invention 100 to indicate whether the intended write/read operation is in interleaved mode or sequential mode;

(A5) DATA_IN, which is used for the SDRAM access control unit of the invention 100 to transfer retrieved data from the SDRAM chip 20 to the memory arbiter 10 that are requested by the memory arbiter 10;

(A6) DATA_OUT, which is used for the SDRAM access control unit of the invention 100 to receive the data from the SDRAM chip 20 that are intended to be written into the SDRAM chip 20;

(A7) READY, which is used for the SDRAM access control unit of the invention 100 to issue a ready signal to the memory arbiter 10;

(A8) LAST_READY, which is used for the SDRAM access control unit of the invention 100 to issue a last ready signal to the memory arbiter 10 to indicate that the last write/read operation is readily completed.

On the other side, the SDRAM access control unit of the invention 100 is interconnected with the SDRAM chip 20 via a number of signal lines as follows:

(B1) RAS-, which is used for the SDRAM access control unit of the invention 100 to issue a row address strobe signal to the SDRAM chip 20;

(B2) CAS-, which is used for the SDRAM access control unit of the invention 100 to issue a column address strobe signal to the SDRAM chip 20;

(B3) WE-, which is used for the SDRAM access control unit of the invention 100 to issue a write enable signal to the SDRAM chip 20; wherein in this embodiment, for example, when WE- is at LOGIC-HIGH state, it indicates that write operation is intended; and whereas when WE- is at LOGIC-LOW state, it indicates that read operation is intended (B4) ADDR, which is used for the SDRAM access control unit of the invention 100 to issue an address signal to the SDRAM chip 20;

(B5) DATA, which is a bi-directional data line for the SDRAM access control unit of the invention 100 to transfer data to the SDRAM chip 20 during write operation, and for the SDRAM chip 20 to transfer data to the SDRAM access control unit of the invention 100 during read operation;

(B6) DQM, which is used for the SDRAM access control unit of the invention 100 to issue a data mask signal to the SDRAM chip 20;

(B7) CS, which is used for the SDRAM access control unit of the invention 100 to issue a chip selection signal to the SDRAM chip 20;

(B8) CKE, which is used for the SDRAM access control unit of the invention 100 to issue a clock enable signal to the SDRAM chip 20.

The SDRAM access control unit of the invention 100 comprises: (a) an address mapping table 110; (b) an access control logic circuit 120; (c) a configuration register 130; (d) a column address control module 140; and (e) a finite state machine 150.

The address mapping table 110 is used to receive the REQ and ADDR signals from the memory arbiter 10 and translate the received ADDR signal into corresponding SDRAM addresses.

The access control logic circuit 120 is interconnected with the memory arbiter 10 via the MODE, LENGTH, DATA_OUT, DATA_IN, READY, and LAST_READY signal lines, and is interconnected with the SDRAM chip 20 via the bi-directional DATA line, for controlling the data flow between the memory arbiter 10 and the SDRAM chip 20.

The configuration register 130 is used to register the configuration parameters of the clocking of various signals of the SDRAM chip 20 to allow the access control logic circuit 120 and the finite state machine 150 to perform access operations to the SDRAM chip 20 accordingly.

The column address control module 140 is coupled to the finite state machine 150 for use to control the row addresses during each access operation under interleaved mode or sequential mode.

The finite state machine 150 is used to generate a corresponding set of access control signals [RAS-, CAS-, WE-, ADDR, DQM, CS, CKE] under control by the address mapping table 110, the access control logic circuit 120, and the column address control module 140 to control the access operations to the SDRAM chip 20.

The SDRAM access control unit of the invention 100 is characterized by that the duration of the column address strobe signal CAS- is set to be equal to the total time length of each burst transfer access operation. For example, if each burst transfer access operation involves the transfer of 4 bits of data, then the CAS- signal line is set at enabled state (assume LOGIC-LOW state) all the time during the burst transfer access operation.

Figure 2:
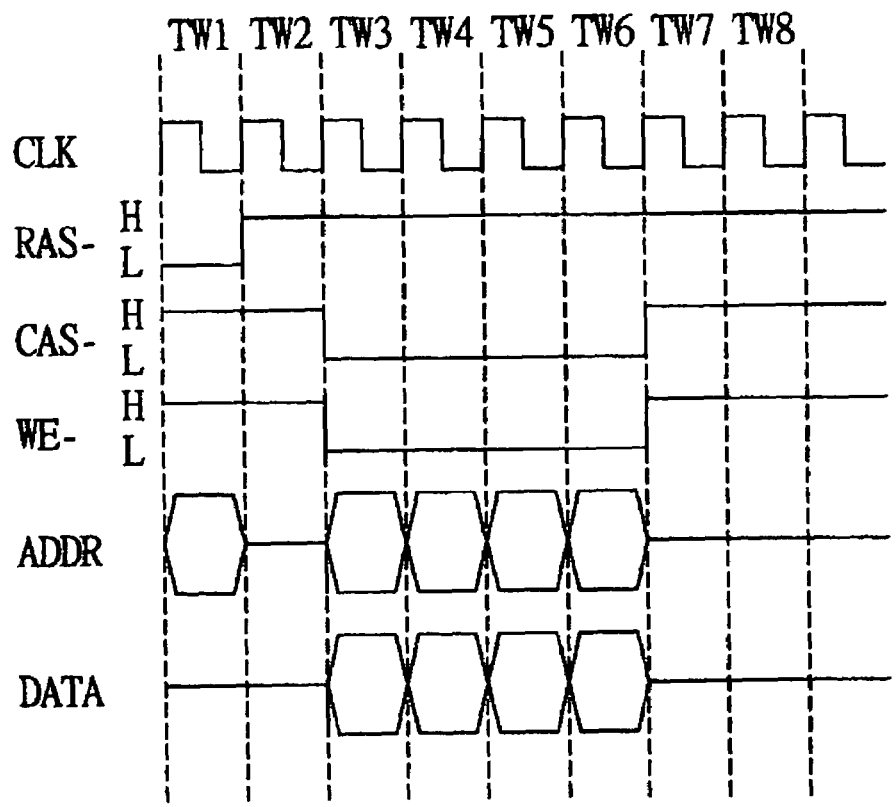
FIG. 2 is a signal sequencing diagram showing the sequence of a number signals used by the SDRAM access control unit of the invention to perform a write operation on the SDRAM chip.
Figure 3:
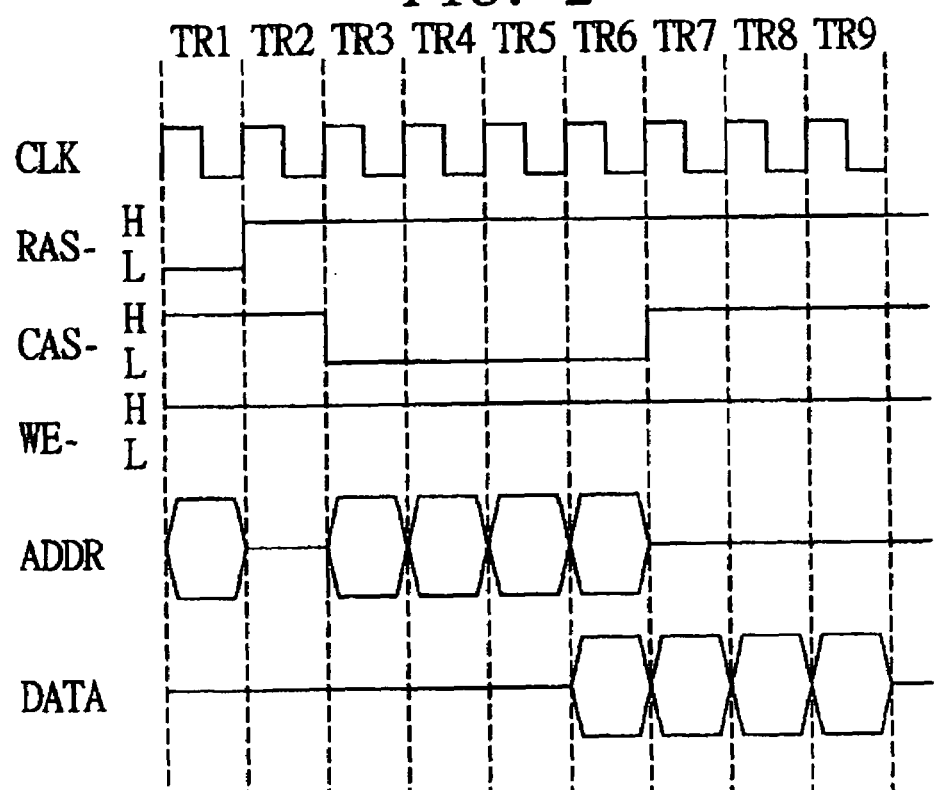
FIG. 3 is a signal sequencing diagram showing the sequence of a number signals used by the SDRAM access control unit of the invention to perform a read operation on the SDRAM chip.

FIG. 2 and FIG. 3 are signal sequencing diagrams respectively showing the sequence of a number signals used by the SDRAM access control unit of the invention 100 to perform a write operation and a read operation on the SDRAM chip 20. In this embodiment, for example, assume each burst transfer access operation involves the transfer of 4 bits of data.

Referring to FIG. 2 together with FIG. 1, when a write operation is requested, then during the first clock pulse TW1, the finite state machine 150 first sets the RAS- signal line to LOGIC-LOW state and then issues an address from the ADDR signal line.

During the second clock pulse TW2, the finite state machine 150 resets the RAS- signal line to LOGIC-HIGH state.

During the third clock pulse TW3, the finite state machine 150 sets the CAS- signal line to LOGIC-LOW state and meanwhile sets the WE- signal line to LOGIC-LOW state. At the same time, the finite state machine 150 outputs the first bit of data from the bi-directional DATA line and issues the corresponding address from the ADDR signal line. This causes the first bit of data to be stored in the specified address in the SDRAM chip 20.

During the fourth clock pulse TW4, the CAS- signal line is continuously maintained at LOGIC-LOW state while the WE- signal line is also continuously maintained at LOGIC-LOW state. During this period, the finite state machine 150 outputs the second bit of data from the bi-directional DATA line and issues the corresponding address from the ADDR signal line. This causes the second bit of data to be stored in the specified address in the SDRAM chip 20.

During the fifth clock pulse TW5, the CAS- signal line is continuously maintained at LOGIC-LOW state while the WE- signal line is also continuously maintained at LOGIC-LOW state. During this period, the finite state machine 150 outputs the third bit of data from the bi-directional DATA line and issues the corresponding address from the ADDR signal line. This causes the third bit of data to be stored in the specified address in the SDRAM chip 20.

During the sixth clock pulse TW6, the CAS- signal line is continuously maintained at LOGIC-LOW state while the WE- signal line is also continuously maintained at LOGIC-LOW state. During this period, the finite state machine 150 outputs the fourth bit of data from the bi-directional DATA line and issues the corresponding address from the ADDR signal line. This causes the fourth bit of data to be stored in the specified address in the SDRAM chip 20.

During the seventh clock pulse TW7, the CAS- signal line is reset to LOGIC-HIGH state while the WE- signal line is also reset to LOGIC-HIGH state. This completes the burst transfer access operation for 4 bits of data.

Referring to FIG. 3 together with FIG. 1, when a read operation is requested, then during the first clock pulse TR1, the finite state machine 150 first sets the RAS- signal line to LOGIC-LOW state and then issues a row address from the ADDR signal line.

During the second clock pulse TR2, the finite state machine 150 resets the RAS- signal line to LOGIC-HIGH state.

During the third clock pulse TR3, the finite state machine 150 sets the CAS- signal line to LOGIC-LOW state. Since the current access operation is a read operation, the WE- signal line is maintained at LOGIC-HIGH state. At the same time, the finite state machine 150 outputs the column address where the requested first bit of data is stored in the SDRAM chip 20. It is to be noted that the latency period is 3 clock pulses, and therefore, the SDRAM chip 20 will output the requested first bit of data until TR6.

During the fourth clock pulse TR4, the CAS- signal line is continuously maintained at LOGIC-LOW state while the WE- signal line is continuously maintained at LOGIC-HIGH state. At the same time, the finite state machine 150 outputs the column address where the requested second bit of data is stored in the SDRAM chip 20. It is to be noted that the latency period is 3 clock pulses, and therefore, the SDRAM chip 20 will output the requested second bit of data until TR7.

During the fifth clock pulse TR5, the CAS- signal line is continuously maintained at LOGIC-LOW state while the WE- signal line is continuously maintained at LOGIC-HIGH state. At the same time, the finite state machine 150 outputs the column address where the requested third bit of data is stored in the SDRAM chip 20. It is to be noted that the latency period is 3 clock pulses, and therefore, the SDRAM chip 20 will output the requested third bit of data until TR8.

During the sixth clock pulse TR6, the CAS- signal line is continuously maintained at LOGIC-LOW state while the WE- signal line is continuously maintained at LOGIC-HIGH state. At the same time, the finite state machine 150 outputs the column address where the requested fourth bit of data is stored in the SDRAM chip 20. It is to be noted that the latency period is 3 clock pulses, and therefore, the SDRAM chip 20 will output the requested fourth bit of data until TR9. During this clock pulse TR6, the latency period for the requested first bit of data is reached, and therefore, the SDRAM chip 20 outputs the requested first bit of data from the bidirectional DATA line.

During the seventh clock pulse TR7, since addressing is completed, the CAS- signal line is reset to LOGIC-HIGH state while the WE- signal line is still maintained at its normal LOGIC-HIGH state. During this clock pulse TR7, the latency period for the requested second bit of data is reached, and therefore, the SDRAM chip 20 outputs the requested second bit of data from the bi-directional DATA line.

During the eighth clock pulse TR8, the latency period for the requested third bit of data is reached, and therefore, the SDRAM chip 20 outputs the requested third bit of data from the bi-directional DATA line.

During the ninth clock pulse TR9, the latency period for the requested fourth bit of data is reached, and therefore, the SDRAM chip 20 outputs the requested fourth bit of data from the bi-directional DATA line. This completes the burst transfer access operation for 4 bits of data.

In conclusion, the invention provides an SDRAM access control unit and method, which is characterized by that characterized by that the duration of the column address strobe signal CAS- is set to be equal to the total time length of each burst transfer access operation, and not just equal to one clock pulse as in the case of prior art. This feature allows the SDRAM access control unit of the invention to freely adjust the burst length (i.e., number of bits) in each burst transfer access operation, without having to use a burst stop command or a precharge-interrupt method as in the case of prior art. This benefit allows the logic circuit structure to be more simplified than prior art. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An SDRAM access control unit for use with an SDRAM chip for controlling a burst transfer access operation on the SDRAM chip wherein the burst transfer access operation is preset to a specified burst data amount;

the SDRAM access control unit comprising:

an address mapping table, which is used to receive a data access request signal and related address signal for the burst transfer access operation and translate the received address signal into corresponding addresses in the SDRAM chip;

an access control logic circuit, which is used to control the burst transfer access operation based on specified mode and burst data length;

a configuration register, which is used to register the configuration parameters of the clocking of various signals of the SDRAM chip;

a column address control module, which is used for control of row addresses during the burst transfer access operation; and a finite state machine, which is capable of generating a set of access control signals based on data from the address mapping table, the access control logic circuit, and the column address control module for control of the burst transfer access operation to the SDRAM chip;

wherein each burst transfer access operation is performed in such a manner that:

during a first clock pulse, a column address strobe signal and a column address signal are issued to the SDRAM chip;

during a second clock pulse, the column address strobe signal is disabled; and during subsequent clock pulses, a column address strobe signal is continuously maintained at enabled state while a sequence of column address signals are successively issued to the SDRAM chip for retrieval of the requested data in the burst transfer access operation.

2. The SDRAM access control unit of claim 1, wherein the SDRAM chip is a DDR SDRAM chip.

3. The SDRAM access control unit of claim 1, wherein in the case of the burst transfer access operation being a write operation, the data are written into the SDRAM chip in synchronization with the column address strobe signal.

4. The SDRAM access control unit of claim 1, wherein in the case of the burst transfer access operation being a read operation, the retrieved data from the SDRAM chip are delayed by a latency period with respect to the column address strobe signal.

5. An SDRAM access control method for use on an SDRAM chip for controlling a burst transfer access operation on the SDRAM chip wherein the burst transfer access operation is preset to a specified burst data amount;

the SDRAM access control method comprising:

during a first clock pulse, issuing a column address strobe signal and a column address signal to the SDRAM chip;

during a second clock pulse, disabling the column address strobe signal; and during subsequent clock pulses, continuously maintaining a column address strobe signal at enabled state while a sequence of column address signals are successively issued to the SDRAM chip for retrieval of the requested data in the burst transfer access operation.

6. The SDRAM access control method of claim 5, wherein the SDRAM chip is a DDR SDRAM chip.

7. The SDRAM access control method of claim 4, wherein in the case of the burst transfer access operation being a write operation, the data are written into the SDRAM chip in synchronization with the column address strobe signal.

8. The SDRAM access control method of claim 4, wherein in the case of the burst transfer access operation being a read operation, the retrieved data from the SDRAM chip are delayed by a latency period with respect to the column address strobe signal.

* * * * *